United States Patent [19]

Lebron

[11] Patent Number: 4,954,812
[45] Date of Patent: Sep. 4, 1990

[54] MAGNETIC FIELD ALARM INDICATOR

[75] Inventor: Fernando C. Lebron, London, Canada

[73] Assignee: London Health Association, Ontario, Canada

[21] Appl. No.: 345,877

[22] Filed: May 1, 1989

[30] Foreign Application Priority Data

Oct. 25, 1988 [CA] Canada ................................ 581126

[51] Int. Cl.⁵ ........................................... G08B 13/24
[52] U.S. Cl. ................................... 340/551; 324/260; 340/573
[58] Field of Search ...................... 340/551, 573, 511; 324/260

[56] References Cited

U.S. PATENT DOCUMENTS

| | | | |
|---|---|---|---|
| 2,551,596 | 5/1951 | Haglund | 324/260 X |
| 3,604,373 | 9/1971 | Crowley et al. | 109/38 |
| 3,961,320 | 6/1976 | Erdmann et al. | 340/551 X |
| 4,053,829 | 10/1977 | Maruo | 324/260 |
| 4,285,158 | 8/1981 | Courts et al. | 324/260 X |
| 4,296,376 | 10/1981 | Bartol, Jr. | 324/260 X |
| 4,362,992 | 12/1982 | Young et al. | 324/260 X |
| 4,527,123 | 7/1985 | Gilman et al. | 324/260 X |
| 4,611,127 | 9/1986 | Ibrahim et al. | 340/551 X |

*Primary Examiner*—Donald O. Woodiel
*Assistant Examiner*—Thomas J. Mullen, Jr.
*Attorney, Agent, or Firm*—Bell, Seltzer, Park & Gibson

[57] ABSTRACT

A magnetic field alarm detector comprised of a plurality of magnetic field detectors mounted in a horizontal plane for detecting respective rotational components of a magnetic field and in response generating respective signals proportional thereto. Each of the detectors is mounted at a predetermined angle with respect to adjacent ones of the detectors, thereby encompassing a 360-degree field of view. Circuitry is included for rectifying and summing the respective signals received from the detectors and in response generating an output signal. Additional circuitry is provided for comparing the output signal to a predetermined set-point signal and in the event the output signal is greater than the set-point signal generating one or both of an audible and visual alarm signal. The alarm indicator of the present invention is particularly useful for measuring high magnetic field strengths for preventing accidental malfunctioning of sensitive medical equipment such as infusion pumps, ventilators, etc., and protecting magnetically sensitive components such as magnetic tapes, credit cards etc.

13 Claims, 3 Drawing Sheets

MAGNETIC FIELD ALARM INDICATOR

FIELD OF THE INVENTION

This invention relates in general to magnetic field detectors, and more particularly to a magnetic field alarm indicator for performing non-directional homogeneous field strength detection in a medical environment.

BACKGROUND OF THE INVENTION

Magnetic field strength detectors are known for measuring the strength of magnetic fields and generating one or more alarm signals in the event that the field strength exceeds a predetermined threshold. For example U.S. Pat. No. 3,604,373 entitled SECURITY STORAGE APPARATUS issued on Sept. 14, 1971, discloses a storage enclosure cabinet for storing magnetic tapes, discs, etc., provided with magnetic field detectors for signalling an excessive level of magnetism within the enclosure cabinet through audio and visual alarms placed at strategic remote points. According to the patented system, Hall Effect magnetic detection elements are provided in pairs for each of a plurality of respective storage spaces. The Hall Effect detectors are provided in pairs for the purpose of redundancy in the event that one of the detectors should fail.

Additional magnetic field strength detectors are disclosed in U.S. Pat. No. 3,961,320; 4,285,158; 4,296,376; 4,362,992; 2,551,596; and 4,527,123.

SUMMARY OF THE INVENTION

The field strength alarm indicator of the present invention is particularly adapted for use in a hospital setting for preventing accidental exposure of magnetically sensitive equipment to large magnetic fields produced by Magnetic Resonance Imaging devices.

The Magnetic Resonance Imager (MRI) is a device used to image different parts of the body in a non-invasive manner. One of the principal components of the MRI is a very powerful magnet. The strength of the magnet is in the order of 0.5 to 2.0 Tesla which is many thousand times the magnetic field of the earth. The MRI device is often used to image patients that may be attached to other types of equipment such as ventilators, infusion pumps, etc. Some of these devices fail to work correctly in the presence of very high magnetic fields within the MRI suite. However, each device may fail in fields of different strengths, and the type of failure is also device-dependent.

Accordingly, the magnetic field alarm indicator of the present invention is adapted for use with magnetically sensitive medical equipment to generate an alarm signal in the event that the medical equipment is moved to within a predetermined distance of the MRI magnet so as to induce a failure of the equipment attached to the patient. Failure of this equipment can cause a medical emergency, even patient death.

Medical equipment such as infusion pumps, ventilators, etc. are frequently mounted on wheeled carts capable of full 360-degree rotation within a horizontal plane. Thus, the magnetic alarm indicator of the present invention is provided with circuitry for measuring the absolute value of magnetic field strength within a full 360-degree field of view independently of the direction of the magnetic field within the horizontal plane.

The essential disadvantage of prior art magnetic field detectors when applied to the problem of the present invention, is that no indication is provided of the absolute value of magnetic field strength magnitude for a full 360-degree field of view. For example, U.S. Pat. No. 4,362,992 entitled SYSTEM AND METHOD OF DETECTING THE PROXIMITY OF AN ALTERNATING MAGNETIC FIELD, issued on Dec. 7, 1982, discloses a system for use with helicopters which detects the proximity of the helicopter to a source of alternating magnetic field, such as that emanating from power transmission cables, and in response generates a warning signal indicative of the proximity of the magnetic field. Sensor coils are mounted along three axes (i.e. one coil for each of the X, Y and Z axes in a right-handed system). The sensitivity of each pair of coils in a given plane varies in relation to the angle of the magnetic field within that plane, with a minimum sensitivity occurring when the direction of the magnetic field is at an equal angle to each pair of axes forming a plane. Thus, the system of U.S. Pat. No. 4,362,992 fails to provide means for detecting the magnetic field intensity or magnitude within a single plane independently of rotation within the plane.

In general, according to the present invention, there is provided a magnetic field alarm indicator comprised of circuitry for detecting the magnitude of a magnetic field within a 360-degree field of view and in response generating an output signal proportional to the magnitude, and circuitry for comparing the output signal to a predetermined set-point signal and in the event that the output signal is greater than the set-point signal generating an alarm signal.

According to the present invention, there is also provided a method of operating an alarm indicator within a magnetic field for generating an alarm signal upon detecting a predetermined strength of the magnetic field, comprising the steps of adjusting the sensitivity of the alarm indicator for optimum operation at peak field intensity of the magnetic field, adjusting the operational threshold of the alarm indicator to generate the alarm signal upon detection of the aforementioned predetermined strength of magnetic field, and horizontally mounting the alarm indicator on a mobile platform capable of movement within the magnetic field, such that the alarm indicator generates the alarm signal in the event that the mobile platform is moved into a portion of the magnetic field having greater than the aforementioned predetermined strength.

BRIEF DESCRIPTION OF THE DRAWINGS

The present invention will be described in greater detail in conjunction with the following drawings, in which:

FIG. 3 is a perspective view showing angular orientation and mounting of three Hall Effect sensors in accordance with the preferred embodiment.

DETAILED DESCRIPTION OF THE PREFERRED EMBODIMENTS

Figure 1:
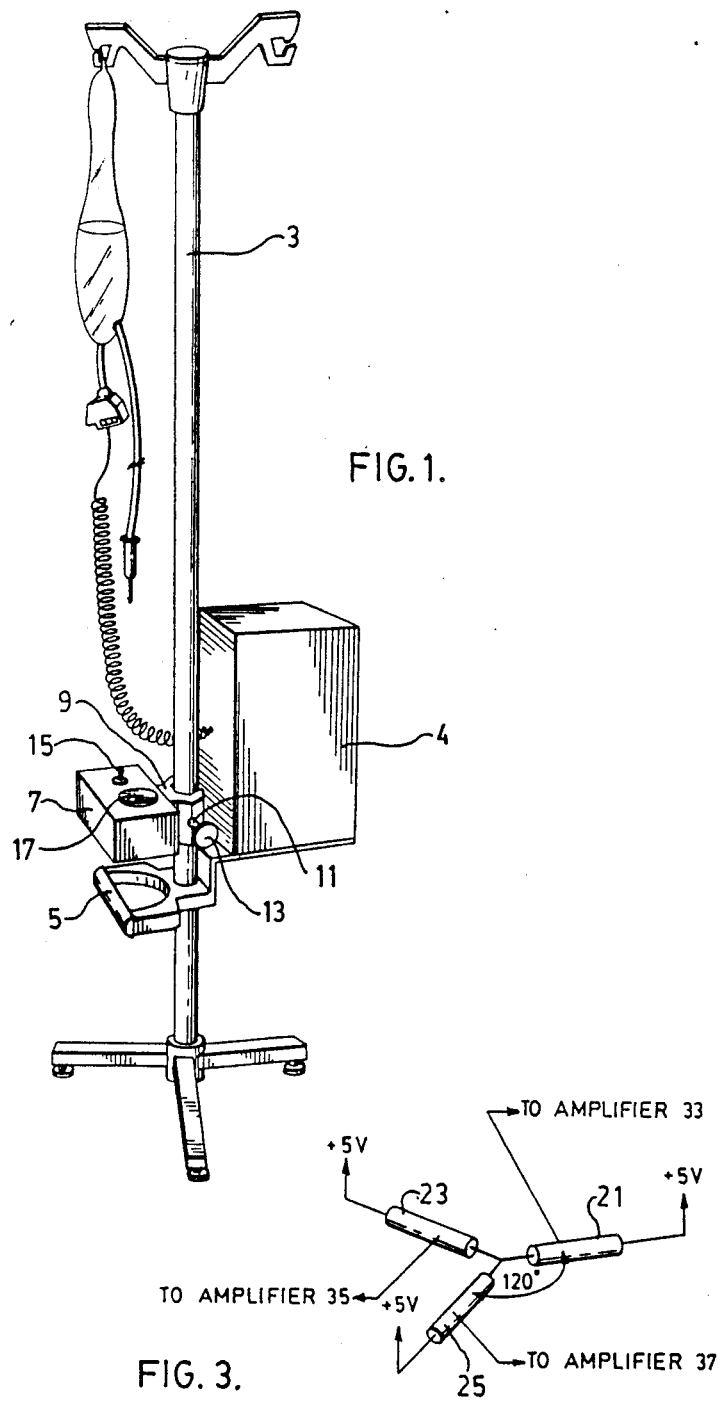
FIG. 1 is a perspective view of a magnetic alarm indicator in accordance with present invention mounted on a mobile infusion pump.

Turning to FIG. 1, an infusion pump 4 is shown mounted to a mobile stand 3. The stand 3 can be manually maneuvered by means of a handle 5. The magnetic field alarm indicator 7 of the present invention is shown mounted to the vertical stand 3.

The magnetic alarm indicator is equipped with an appropriate attachment apparatus to the device to be protected. In accordance with the embodiment of FIG. 1, the magnetic alarm indicator 7 is provided with a vice grip arrangement 9 including a threaded bolt portion 11 and adjustment knob 13 for securing the alarm indicator 7 to the vertical stand 3 in a horizontal plane. The alarm indicator 7 is provided with a power switch 15 and audible alarm output 17, as described in greater detail below.

Figure 2:
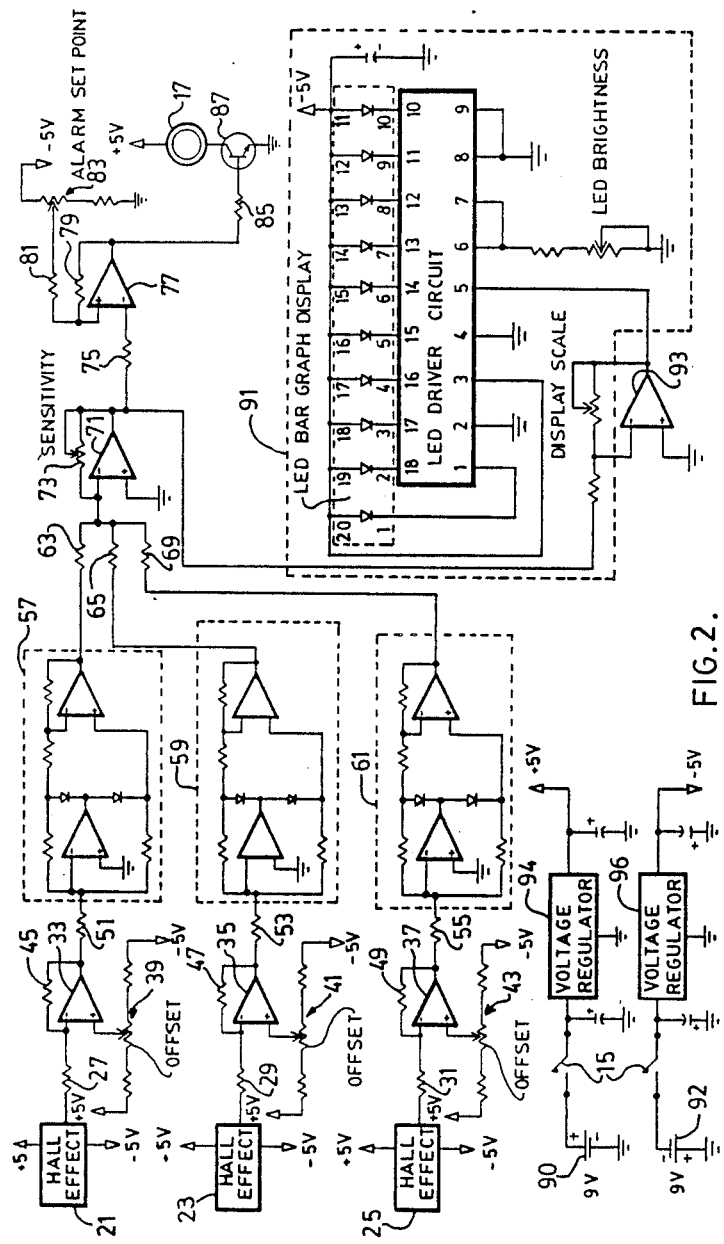
FIG. 2 is a schematic diagram of the magnetic alarm indicator, in accordance with a preferred embodiment of the present invention.

Turning to FIG. 2, the circuitry comprising a preferred embodiment of the magnetic alarm indicator of the present invention is shown comprised of three Hall Effect sensors or transducers 21, 23 and 25. Hall Effect sensors 21, 23 and 25 are well known devices for generating an output signal voltage proportional to the strength of a magnetic field passing therethrough. The Hall Effect sensors are mounted in a horizontal plane, as shown in FIG. 3 with an angular separation of 120 degrees between each of the sensors.

Respective outputs of Hall Effect sensors 21, 23 and 25 are connected via resistors 27, 29 and 31 to inverting inputs of respective operational amplifiers 33, 35 and 37. Non-inverting inputs of the operational amplifiers 33, 35 and 37 are connected to respective potentiometer circuits shown generally as 39, 41 and 43, for applying appropriate adjustable offset voltages to the operational amplifiers, as discussed in greater detail below. Respective outputs of the operational amplifiers 33, 35 and 37 are connected to the respective inverting terminals thereof via respective feedback resistors 45, 47 and 49, in a well known manner.

The outputs of operational amplifiers 33, 35 and 37 are also applied via respective resistors 51, 53 and 55 to respective absolute value circuits 57, 59 and 61. The absolute value circuits 57, 59 and 61 are of known design (e.g. see Microelectronics by Jacob Millman, McGraw Book Company, 1979, page 594) for providing full wave rectification of an input signal with controllable gain.

The respective outputs of absolute value circuits 57, 59 and 61 are connected via resistors 63, 65 and 69 to the inverting input of a summing amplifier 71. The non-inverting input of amplifier 71 is connected to ground and an output of amplifier 71 is connected to the inverting input thereof via adjustable resistance feedback potentiometer 73. The summing amplifier 71 functions as an adder whose output is a linear combination of the inputs.

The output of summing amplifier 71 is connected via a further resistor 75 to the inverting input of a comparator 77. The input of comparator 77 is connected to the non-inverting input thereof via resistor 79 to provide hysteresis, the non-inverting input of the comparator 77 is then connected, via resistor 81, to an alarm set-point potentiometer circuit shown generally as 83. The potentiometer circuit 83 effectively adjusts the positive threshold voltage applied to comparator 77.

The output of comparator 77 is also connected via resistor 85 to the base of an NPN transistor 87 having an emitter terminal connected to ground and a collector terminal connected to audible alarm indicator 17, which can be a buzzer or beeper, etc.

The output of summing amplifier 71 is also connected to an optional visual display device 91 in the form of a well known LED bargraph display and driver. An additional amplifier 93 is also typically provided for amplifying the signal output from summing amplifier 71 prior to application to the control signal input of the LED driver circuit within display device 91.

A power supply circuit is also provided in the form of two 9-volt batteries 90 and 92 connected via ganged power (ON/OFF) switch 15 to a pair of respective regulator circuits 94 and 96. Regulator 94 is in the form of a standard three terminal, positive, fixed-voltage monolithic regulator for generating a +5V source, while regulator 96 is in the form of a negative, fixed voltage, monolithic regulator for generating a −5V source.

In operation, the magnetic alarm indicator of the present invention generates three channels of magnetic information signal, each channel being derived from the output of respective Hall Effect sensors 21, 23 and 25. As discussed above, the Hall Effect sensors produce a voltage output proportional to the magnetic field intensity vector perpendicular to the face of the sensor.

In order to detect the magnetic field independent of the rotation of the sensors, the three Hall Effect sensors are arranged in a horizontal plane as shown in FIG. 3, with an angle of 120 degrees between each sensor. Power is applied to the circuit by closing switch 15, and the output of each sensor is adjusted to account for offset differences between the sensors. In particular, the control potentiometers 39, 41 and 43 associated with the respective Hall Effect sensors are first adjusted in a zero magnetic field in order to null the respective outputs of amplifiers 33, 35 and 37 to zero volts.

The next step involves adjusting the sensitivity of summing amplifier 71 via potentiometer 73 in order that amplifier 71 generates a voltage swing from zero to 5 volts DC within the maximum expected magnetic field intensity at the MRI site.

Adjustment of the display scale for visual display 91 is effected in a similar manner to the sensitivity adjustment, such that the top bargraph element of the LED display is illuminated at maximum magnetic field intensity.

The alarm set-point is then adjusted via potentiometer 83 for causing comparator 77 to generate an audio signal enabling voltage (i.e. logic high voltage) tailored to the maximum magnetic field intensity to which an associated medical instrument (e.g. infusion pump 4) can be subjected while still working properly. Determination of the maximum field strength for the correct operation of the medical instrument to be protected is carried out without having a patient attached to the medical instrument. The distance from the magnet at which the medical instrument first malfunctions is noted and the alarm setpoint is set such that the magnetic alarm indicator generates an audible alarm when any of the previously determined distances are encroached. A 360-degree rotation of the device should also be performed to ensure that the alarm will sound at the measured non-safe distance for all angles.

In normal usage, the DC voltage outputs from respective ones of the Hall Effect sensors 21, 23 and 25 are amplified to appropriate levels via amplifiers 33, 35 and 37 and thereafter rectified via circuits 57, 59 and 61 for generating absolute value voltage signals proportional to the detected magnetic field strength at each of the angularly displaced sensors. The absolute value circuit ensures that the alarm indicator responds equally for fields pointing towards the face of each sensor as for fields pointing away from the sensor.

The outputs of the three absolute value circuits 57, 59 and 61 are summed via amplifier 71. The signal output from amplifier 71 varies in relation to a 360-degree rotation in the form of three full-wave sine waveforms 120 degrees out of phase to one another (i.e. a full-wave rectified triphasic wave form).

Figure 4:
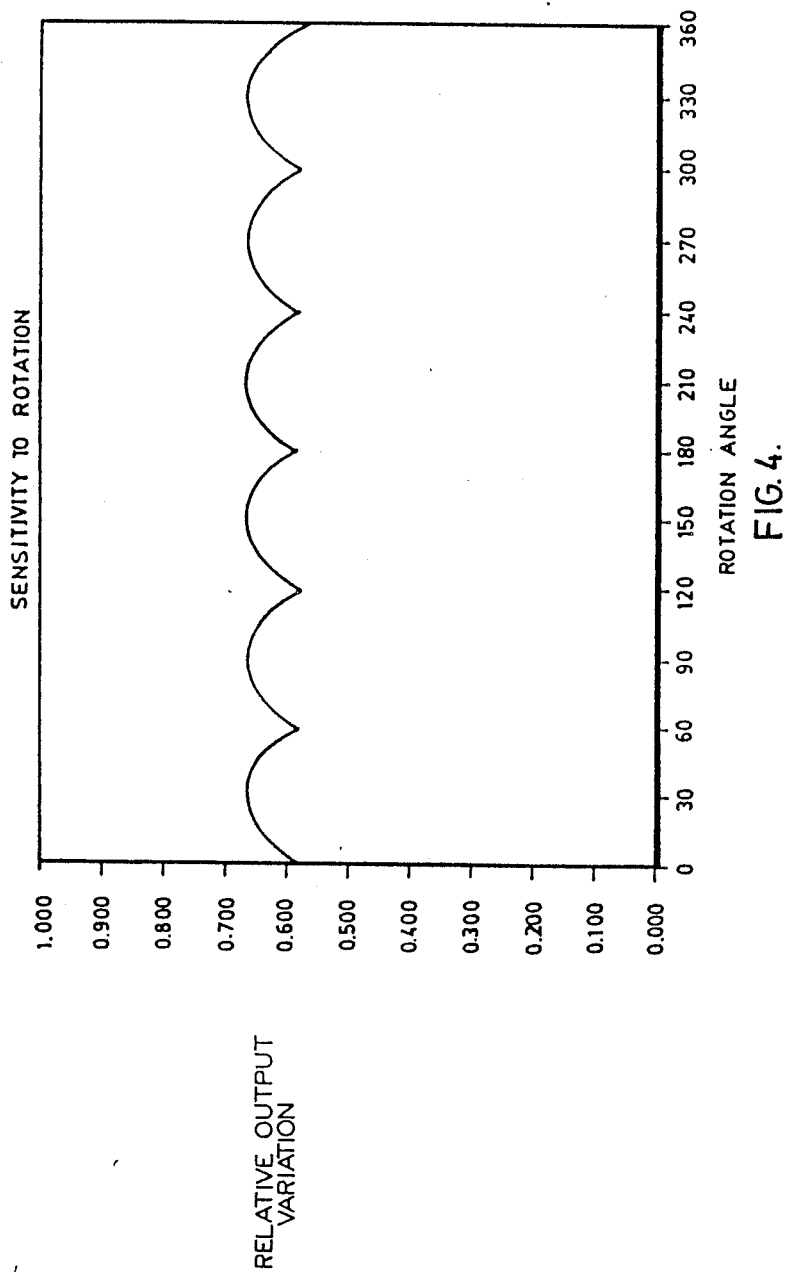
FIG. 4 is a graph of the output signal variation of the magnetic alarm indicator of the present invention versus angle of rotation.

FIG. 4 is a graph showing the variation in voltage output from amplifier 71 for a full 360-degree rotation of the sensors. The vertical axis indicates the percentage signal output from amplifier 71 with an arbitrary scale of from zero to one. The horizontal axis indicates the rotation angle in degrees. The maximum output variation with rotation is calculated to be 8.9% for the arrangement of FIGS. 2 and 3 (i.e. three sensors oriented at 120-degree angular separation). Accordingly, the sensitivity is adjusted vi potentiometer 73 for causing generation of an alarm signal in the event that the detected magnetic field strength exceeds the minimum shown in the graph of FIG. 4. In other words, the safe operating distance for the associated medical instrument corresponds to the minimum shown on the graph.

It will be understood that four or more sensors may be used instead of the three sensors of the preferred embodiment. The use of a greater number of sensors contributes to less maximum output variation with rotation in the horizontal field. However, it has been determined that for the present application (i.e. detection of magnetic field strengths dangerous for medical instruments) an 8.9% maximum output variation is adequate.

The signal output from amplifier 71 is transmitted to the audio alarm circuitry comprising amplifier 77, switching transistor 87 and audible alarm indicator 89, and optional visual indicator 91.

As discussed above, the alarm set-point is adjusted such that comparator 77 enables the audible alarm 89 via transistor 87 in the event that the field strength exceeds the pre-set value defined by the alarm set-point.

Visual display 91 generates a preferably 8-stage LED bargraph display of the field strength, and operates in a well-known manner. This indication can be used for measurement purposes.

In summary, the magnetic field alarm indicator of the present invention incorporates a multiplicity of magnetic field strength detectors disposed in a single plane (e.g. horizontal plane) and oriented with equal angular separation between each for effecting a full 360-degree field of view. Furthermore, the field strength output signals of the sensors are full wave rectified in order to give an accurate indication of the magnetic field strength independently of the field direction.

The circuitry which is provided for sensitivity adjustment enables the alarm indicator of the present invention to be used with any of a plurality of medical instruments, each of which may be subject to malfunction at different magnetic field strengths. The device of the present invention is expected to overcome the difficulties presently encountered in the medical field when using magnetically sensitive instruments in the vicinity of Magnetic Resonance Imaging equipment.

Additional embodiments and applications of the present invention are possible.

For example, as discussed above, four or more magnetic field detectors, such as Hall Effect sensors, may be used to decrease the output signal variation in relation to rotation of the detectors.

Also, the alarm indicator of the present invention need not be limited to use in a medical environment, but may advantageously be applied to situations requiring accurate detection and alarm indication of magnetic field strength, such as protection against accidental erasure of credit cards, magnetic tapes, floppy discs, etc.

All such embodiments are believed to be within the sphere and scope of the present invention as defined in the claims appended hereto.

I claim:

1. A magnetic field alarm indicator, comprising means for detecting the magnitude of a magnetic field within a 360-degree field of view and in response generating an output signal proportional to said magnitude, said means for detecting comprises a plurality of magnetic field detectors mounted in the same plane for detecting respective rotational components of said field and in response generating respective signals proportional thereto, each of said detectors being oriented at a predetermined angle with respect to adjacent ones of said detectors thereby encompassing said 360-degree field of view, and means for comparing said output signal to a predetermined set-point signal and in the event said output signal is greater than said set-pint signal generating an alarm signal.

2. A magnetic field alarm indicator as defined in claim 1, wherein said means for detecting further comprises rectifying means and summing means for rectifying and summing said respective signals and in response generating said output signal.

3. A magnetic field alarm indicator as defined in claim 2, further comprising means for adjusting sensitivity of said summing means for optimum operation at peak field intensity of said magnetic field.

4. A magnetic field alarm indicator as defined in claim 3, wherein said rectifying means comprises respective absolute value circuits connected to respective outputs of said plurality of magnetic field detectors.

5. A magnetic field alarm indicator as defined in claim 3, wherein said summing means comprises a summing amplifier having an input connected to respective ones of said absolute value circuits and an output connected to said means for comparing, said means for adjusting sensitivity being comprised of a potentiometer connected to said input and said output of said summing amplifier for controlling the gain thereof.

6. A magnetic field alarm indicator as defined in claim 1, wherein said magnetic field detectors are Hall Effect sensors mounted in a horizontal plane.

7. A magnetic field alarm indicator as defined in claim 2, wherein said plurality of magnetic field detectors comprises three Hall Effect sensors mounted in a horizontal plane, said predetermined angle being 120 degrees.

8. A magnetic field alarm indicator as defined in claim 1, wherein said plurality of magnetic field detectors comprises four Hall Effect sensors mounted in a horizontal plane, said predetermined angle being 90 degrees.

9. A magnetic field alarm indicator as defined in claim 1 further comprising means for adjusting said set-point signal in order to cause generation of said alarm signal at various predetermined magnitudes of said magnetic field.

10. A magnetic field alarm indicator as defined in claim 1, wherein said means for comparing comprises a comparator having a first input for receiving said set-point signal, a second input for receiving said output signal and an output connected to an audible alarm generator for generating said alarm signal.

11. A magnetic field alarm indicator as defined in claim 1, further comprising visual display means for receiving said output signal and in response generating a visual representation thereof.

12. A magnetic field alarm indicator as defined in claim 11, wherein said visual display means comprises an LED bargraph display.

13. A method of operating an alarm indicator within a magnetic field for generating an alarm signal upon detecting a predetermined strength of said field, wherein said alarm indicator comprises means for detecting the magnitude of a magnetic field within a 360-degree field of view and in response generating an output signal proportional to said magnitude, said means for detecting comprises a plurality of magnetic field detectors mounted in the same plane for detecting respective rotational components of said field and in response generating respective signals proportional thereto, each of said detectors being oriented at a predetermined angle with respect to adjacent ones of said detectors thereby encompassing said 360-degree field of view, and means for comparing said output signal to a predetermined set-point signal and in the event said output signal is greater than said set-point signal generating an alarm signal, comprising the steps of:
  (a) adjusting sensitivity of said alarm indicator for optimum operation at peak field intensity of said magnetic field,
  (b) adjusting an operational threshold of said alarm indicator to generate said alarm signal upon detection of said alarm signal upon detection of said predetermined strength of said magnetic filed, and
  (c) horizontally mounting said alarm indicator on a mobile medical instrument capable of movement within said magnetic field, such that said alarm indicator generates said alarm signal in the event said mobile medical instrument is moved into a portion of said field having greater than said predetermined strength.

* * * * *

UNITED STATES PATENT AND TRADEMARK OFFICE
CERTIFICATE OF CORRECTION

PATENT NO. : 4,954,812

DATED : September 4, 1990

INVENTOR(S) : Fernando C. Lebron

It is certified that error appears in the above-identified patent and that said Letters Patent is hereby corrected as shown below:

ON THE TILE PAGE,
IN THE ABSTRACT:

Line 1, "detector" should be -- indicator --.

Line 17, after the word "strengths" insert -- in the vicinity of magnetic resonance imaging systems --.

Column 6, line 29, "set-pint" should be -- set-point --.

Signed and Sealed this

Seventh Day of April, 1992

Attest:

HARRY F. MANBECK, JR.

*Attesting Officer*     *Commissioner of Patents and Trademarks*